United States Patent
Chen et al.

(10) Patent No.: US 6,265,269 B1
(45) Date of Patent: Jul. 24, 2001

(54) METHOD FOR FABRICATING A CONCAVE BOTTOM OXIDE IN A TRENCH

(75) Inventors: Chien-Hung Chen, Tainan Hsien; Chih-Ta Wu, Hsinchu; Ching-Shun Lin, Tainan; Juinn-Sheng Chen, Taipei, all of (TW)

(73) Assignee: Mosel Vitelic Inc., Hsinchu (TW)

( * ) Notice: Subject to any disclaimer, the term of this patent is extended or adjusted under 35 U.S.C. 154(b) by 0 days.

(21) Appl. No.: 09/369,266

(22) Filed: Aug. 6, 1999

(51) Int. Cl.[7] .................................................. H01L 21/336
(52) U.S. Cl. ......................... 438/270; 438/269; 438/138
(58) Field of Search .................................... 438/268, 270, 438/282, 197, 200, 133, 138, 778, 788

(56) References Cited

U.S. PATENT DOCUMENTS

| 5,326,711 | * | 7/1994 | Malhi . |
| 5,532,179 | * | 7/1996 | Chang et al. . |
| 5,648,283 | * | 7/1997 | Tsang et al. . |
| 5,888,880 | * | 3/1999 | Gardner et al. . |
| 5,897,343 | * | 4/1999 | Mathew et al. . |
| 5,937,296 | * | 8/1999 | Arnold . |
| 6,114,194 | * | 9/2000 | Hsu . |
| 6,133,099 | * | 10/2000 | Sawada . |

* cited by examiner

*Primary Examiner*—Charles Bowers
*Assistant Examiner*—Stephen W. Smoot
(74) *Attorney, Agent, or Firm*—Nath & Associates; Harold L. Novick

(57) ABSTRACT

A method for forming a concave bottom oxide layer in a trench, comprising: providing a semiconductor substrate; forming a pad oxide layer on the semiconductor substrate; forming a silicon nitride layer on the pad oxide layer; etching the silicon nitride layer, the pad oxide layer and the semiconductor substrate to form the trench in the semiconductor substrate; depositing a silicon oxide layer to refill into the trench and cover on the silicon nitride layer, wherein the silicon oxide layer has overhang portions at corners of the trench; anisotropically etching the silicon oxide layer to form a concave bottom oxide layer in the trench; etching the silicon oxide layer to remove the silicon oxide layer on the silicon nitride layer and the sidewalls of the trench; removing the silicon nitride layer and the pad oxide layer.

14 Claims, 2 Drawing Sheets

METHOD FOR FABRICATING A CONCAVE BOTTOM OXIDE IN A TRENCH

FIELD OF THE INVENTION

The present invention relates to a method for fabricating a power device in a trench, more particularly, to a method for fabricating a concave bottom oxide to serve as an insulating layer of a power device in a trench.

BACKGROUND OF THE INVENTION

As a conventional power MOSFET, a DMOS (Double diffusion MOS) structure has been generally used. However, such a structure has the following problems when increasing the integration density by applying a fine pattern structure thereon.

First, a diffusion length of a lateral direction for forming a base region is limited to a pitch of design layout. Second, a parasitic JFET (Junction FET) formed between contiguous base regions narrows a path through which a current vertically flows, thereby to increase a resistance component of a buffer layer.

The tendencies of the problems are enhanced when the design pitch is set to be small. As a result, since an optimum value is present in the layout, a decrease in on-resistance may be limited even if the integration density is increased. However, when the area of an element is increased to decrease the on-resistance, a production cost may be increased, and problems such as an unstable operation of the element or parasitic oscillation caused by parallel connection may caused.

For this reason, a MOSFET having a gate formed in a trench, a source formed above the gate, and a substrate used as a drain has been developed. To realize trench-type MOSFET in a high integration density, the gate oxide layer in the trench must be thin in order to enhance current drive, that is to decrease the on-resistance. The thinning of the gate oxide in the trench has highly potential risks, that is a very high current density will punch through the gate oxide layer at the bottom of the trench. For solving this issue, a thick bottom gate oxide is formed in the trench instead of this gate oxide layer.

In the conventional technology for fabricating a power MOS device, the power MOS device is fabricated in a trench in a semiconductor substrate and the source/drain regions are fabricated in the trench, too. Before the power MOS device is fabricated in the trench, a bottom oxide layer is firstly formed in the trench. The source/drain regions and the gate are then formed in the trench and the bottom oxide layer in the trench is served as an insulating layer of the power MOS device. In prior art, the bottom oxide layer is planar and the corner between the bottom oxide layer and the trench has an angle about 90 degrees. Besides, the source or drain region of a trench power MOS is formed on the bottom oxide layer in the trench and a spike effect of the trench power MOS device often occurs on the perpendicular corner between the sidewall of the trench and the bottom oxide layer.

Thus, changing the perpendicular corner between the sidewall of the trench and the bottom oxide layer in the trench into a non-perpendicular corner can prevent a trench power MOS device from a current leakage from the source/drain regions of the trench power MOS device. In other word, it is not necessary to have a sharp trench to prevent the corner from forming a spike.

Therefore, what is needed is to form a bottom oxide layer having a concave surface and the bottom oxide layer is served as an insulating layer of a trench power MOS device.

SUMMARY OF THE INVENTION

A method for forming a concave bottom oxide layer in a trench, comprising: providing a semiconductor substrate; forming a pad oxide layer on the semiconductor substrate; forming a silicon nitride layer on the pad oxide layer; etching the silicon nitride layer, the pad oxide layer and the semiconductor substrate to form the trench in the semiconductor substrate; depositing a silicon oxide layer to refill into the trench and cover on the silicon nitride layer, wherein the silicon oxide layer has overhang portions at corners of the trench; anisotropically etching the silicon oxide layer to form a concave bottom oxide layer in the trench; etching the silicon oxide layer to remove the silicon oxide layer on the silicon nitride layer and the sidewalls of the trench; removing the silicon nitride layer and the pad oxide layer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention discloses a method for fabricating a power device in a trench, more detail, a method for fabricating a concave bottom oxide to serve as an insulating layer of a power device in a trench.

Firstly, a semiconductor substrate is provided. A pad oxide layer is formed on the semiconductor substrate and a silicon nitride layer is formed on the pad oxide layer. The silicon nitride layer is served as an etching stopper layer for refilling silicon oxide material into a trench in the semiconductor substrate. Next, a trench is formed in the semiconductor substrate. A silicon oxide layer is deposited to refill into the trench and cover on the silicon nitride layer. The preferred deposition process for depositing the silicon oxide layer is a plasma-enhanced-chemical-vapor deposition (PECVD) process. In virtue of the depositing characteristic of PECVD process, the overhang portions of the silicon oxide layer is formed at the corner between the trench and the silicon nitride layer and the width of the trench is narrowed by the overhang portions of the silicon oxide layer. After that, an anisotropical etching process is performed to etch the silicon oxide layer with the overhang portions as an etching mask to protect the silicon oxide layer near the sidewall of the trench. After the anisotropical etching process, the silicon oxide layer has a concave surface on the bottom of the trench. Then, an etching process is performed to remove the silicon oxide layer on the sidewall of the trench and on the silicon nitride layer. The silicon nitride layer and the pad oxide layer are removed by using a conventional technique. Finally, a power MOS device is formed in the trench.

Figure 1:
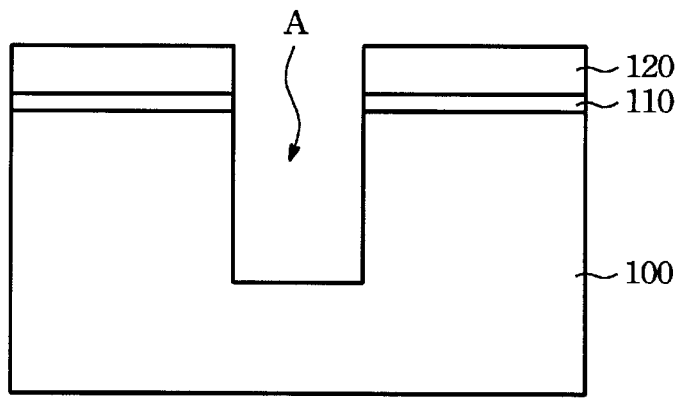
FIG. 1 shows a cross-section view of a semiconductor substrate illustrating that a trench is formed in the semiconductor substrate in accordance with the present invention.

Referring to FIG. 1, a semiconductor substrate 100 is provided for a basis of a trench power MOS device. A pad oxide layer 110 is formed on the semiconductor substrate 100 and a silicon nitride layer 120 is formed on the pad oxide layer 110 to serve as an etching stopper layer. A trench A is formed in the substrate 100 by using a conventional technique.

Figure 2:
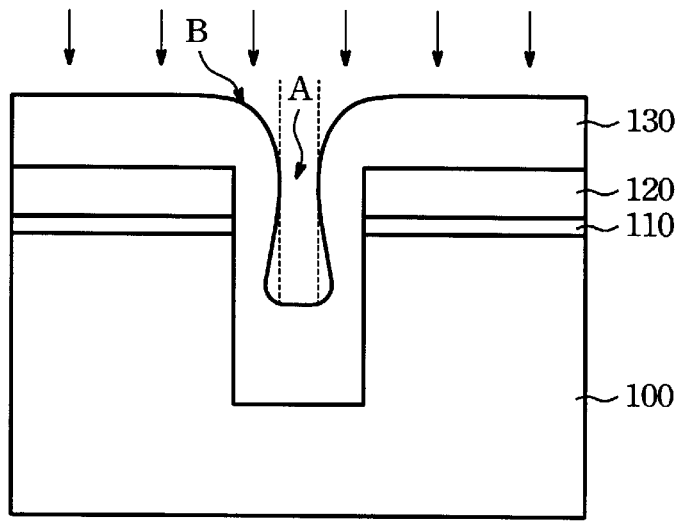
FIG. 2 shows a cross-section view of a semiconductor substrate illustrating that a silicon oxide layer is refilled into the trench and covers the silicon nitride in accordance with the present invention.

Referring to FIG. 2, a silicon oxide layer 130 is deposited to refill into the trench A and cover on the silicon nitride layer 120. The silicon oxide layer 130 in the trench A has a void. That is, the silicon oxide layer 130 does not completely fill the trench A. Furthermore, the silicon oxide layer 130 is deposited by using a plasma-enhanced-chemical-vapor-deposition (PECVD) process and the silicon oxide layer 130 has overhang portions B at the corner between the trench and the silicon nitride layer 120. In a preferred embodiment of the present invention, the thickness of the silicon oxide layer 130 ranges between about 1500 to 5000 angstroms.

Figure 3:
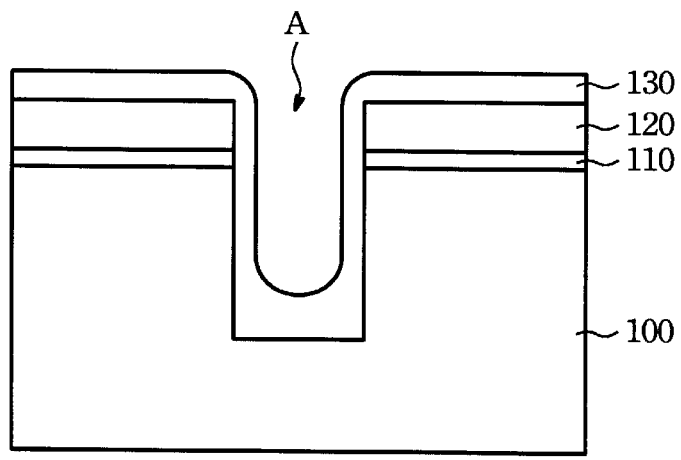
FIG. 3 shows a cross-section view of a semiconductor substrate illustrating that the silicon oxide layer is etched to form a concave bottom oxide layer in the trench in accordance with the present invention.

Referring to FIG. 3, an anisotropical etching process is performed to etch the silicon oxide layer 130 by using the overhang portions B of the silicon oxide layer 130 as an etching mask to protect the silicon oxide layer 130 near the sidewalls of the trench A. After the etching process of the silicon oxide layer 130, the silicon oxide layer 130 in the trench A has a concave surface. In a case, the anisotropical etching to form a concave bottom oxide layer in the trench A is a dry etching process. As the overhang portions B of the silicon oxide layer 130 protect the silicon oxide layer 130 near the sidewall at the bottom of the trench A, the etching rate of the silicon oxide layer 130 near the sidewall of the trench A is slower than that of the silicon oxide layer 130 at the central region of the bottom of the trench A. Since the overhang portions B protects the silicon oxide layer 130 located on the bottom of the trench, the silicon oxide layer 130 on the bottom of the trench can survive during the subsequent etching process.

Figure 4:
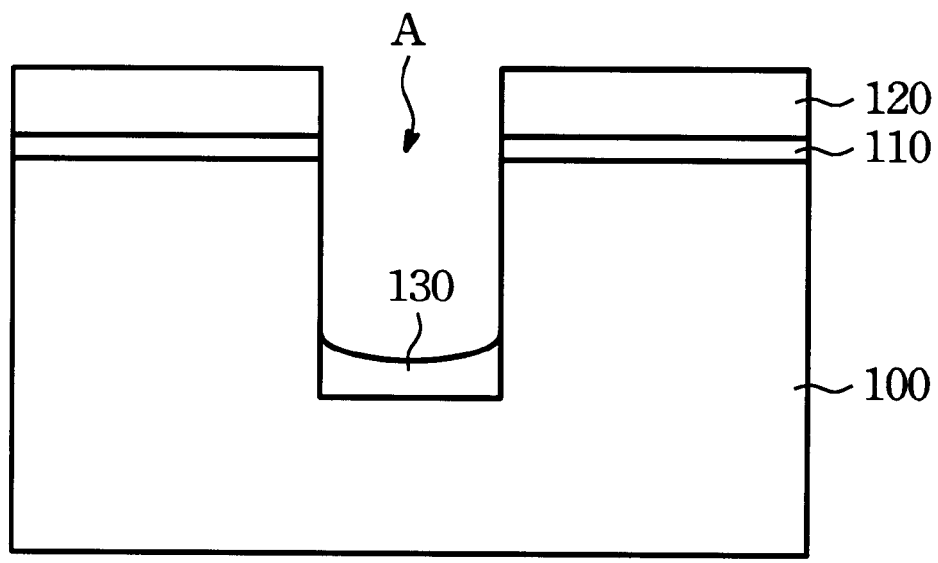
FIG. 4 shows a cross-section view of a semiconductor substrate illustrating that the silicon oxide layer in the trench and on the substrate is removed in accordance with the present invention.

Referring to FIG. 4, an etching process is performed to remove the remaining silicon oxide layer 130 on the silicon nitride layer 120 and the sidwall of the trench A. After that, a concave bottom oxide layer, namely, the remaining silicon oxide layer 130, is formed at the bottom of the trench A. In the preferred embodiment of the present invention, the etching process is a wet etching process or an isotropical etching process.

Figure 5:
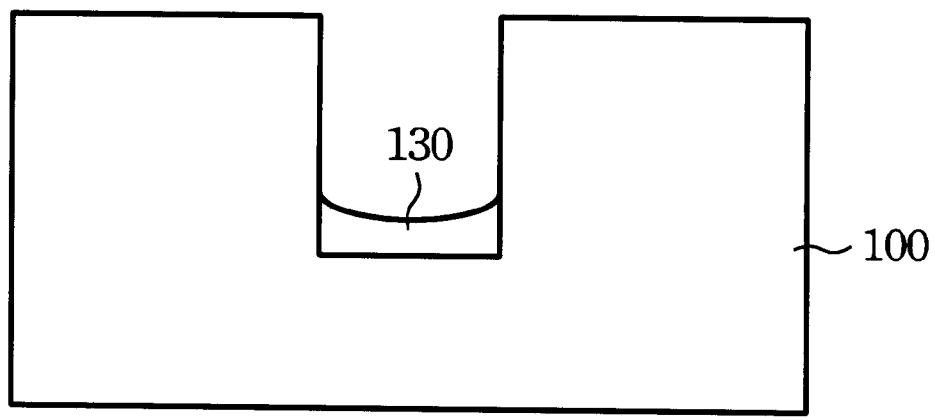
FIG. 5 shows a cross-section view of a semicoductor substrate illustrating that a pad silicon oxide layer and a silicon nitride layer is removed by using a conventional dipped technology in accordance with the present invention.

Referring to FIG. 5, the silicon nitride layer 120 and the pad oxide layer 110 are removed by using a conventional technique. After the concave bottom oxide layer is formed in the trench A, a trench power MOS device is formed in the trench A.

In the present invention, a concave bottom oxide layer is formed in a trench to serve as an insulating layer of a trench power MOS device. That prevents the trench power MOS device from discharging on source/drain regions of the MOS device. The concave bottom oxide layer is formed by using a dry etching process and the overhang portions of the silicon oxide layer decreases the etching rate of the silicon oxide layer near the sidewall of the trench to form a concave surface.

While the preferred embodiment of the invention has been illustrated and described, it will be appreciated that various changes can be made therein without departing from the spirit and scope of the invention.

What is claimed is:

1. A method for forming a concave bottom oxide layer in a trench, comprising:

providing a semiconductor substrate;

forming a pad oxide layer on said semiconductor substrate;

forming a silicon nitride layer on said pad oxide layer;

etching said silicon nitride layer, said pad oxide layer and said semiconductor substrate to form said trench in said semiconductor substrate;

depositing a silicon oxide layer to refill into said trench and cover on said silicon nitride layer, wherein said silicon oxide layer has overhang portions at the silicon nitride corners of said trench;

anisotropically etching said silicon oxide layer to form a concave bottom oxide layer in said trench;

etching said silicon oxide layer to remove said silicon oxide layer on said silicon nitride layer and on sidewalls of said trench; and removing said silicon nitride layer and said pad oxide layer.

2. The method according to claim 1, wherein said silicon oxide layer is deposited by using a plasma enhanced chemical vapor deposition (PECVD) process.

3. The method according to claim 1, wherein said silicon oxide layer is anisotropically etched by using a dry etching process.

4. The method according to claim 1, wherein said silicon oxide layer is anisotropically etched by using said overhang portions at said corners of said trench as an etching mask to protect said silicon oxide layer near said sidewalls at a bottom of said trench.

5. The method according to claim 1, wherein said concave bottom oxide layer serves as an insulating layer of a trench MOS to prevent said trench MOS from current leakage.

6. The method according to claim 1, wherein said silicon oxide layer is etched to remove said silicon oxide layer on said sidewalls of said trench and on said silicon nitride layer by using a wet etching process.

7. A method for forming a concave bottom oxide layer in a trench, comprising:

providing a semiconductor substrate;

forming a pad oxide layer on said semiconductor substrate;

forming a silicon nitride layer on said pad oxide layer;

etching said silicon nitride layer, said pad oxide layer and said semiconductor substrate to form said trench in said semiconductor substrate;

depositing a silicon oxide layer by using a plasma enhanced chemical vapor deposition (PECVD) process to refill into said trench and cover on said silicon nitride layer whereby overhang portions of said silicon oxide layer are formed at the silicon nitride corners of said trench;

anisotropically etching said silicon oxide layer to form a concave bottom oxide layer in said trench by using said overhang portions of said silicon oxide layer to protect said silicon oxide layer near sidewalls at a bottom of said trench;

etching said silicon oxide layer to remove said silicon oxide layer on said silicon nitride layer and on said sidewalls of said trench; and removing said silicon nitride layer and said pad oxide layer.

8. The method according to claim 7, wherein said silicon oxide layer is anisotropically etched by using a dry etching process.

9. The method according to claim 7, wherein said concave bottom oxide layer serves as an insulating layer of a trench MOS to prevent said trench MOS from current leakage.

10. The method according to claim 7, wherein said silicon oxide layer is etched to remove said silicon oxide layer on said sidewalls of said trench and on said silicon nitride layer by using a wet etching process.

11. A method for forming a power MOS in a trench, comprising:

providing a semiconductor substrate;

forming a pad oxide layer on said semiconductor substrate;

forming a silicon nitride layer on said pad oxide layer;

etching said silicon nitride layer, said pad oxide layer and said semiconductor substrate to form said trench in said semiconductor substrate;

depositing a silicon oxide layer by using a plasma enhanced chemical vapor deposition (PECVD) process to refill into said trench and cover on said silicon nitride layer whereby overhang portions of said silicon oxide layer are formed at the silicon nitride corners of said trench;

anisotropically etching said silicon oxide layer to form a concave bottom oxide layer in said trench by using said overhang portions of said silicon oxide layer to protect said silicon oxide layer near sidewalls at a bottom of said trench;

etching said silicon oxide layer to remove said silicon oxide layer on said silicon nitride layer and on said sidewalls of said trench;

removing said silicon nitride layer and said pad oxide layer; and forming said power MOS in said trench.

12. The method according to claim 11, wherein said silicon oxide layer is anisotropically etched by using a dry etching process.

13. The method according to claim 11, wherein said concave bottom oxide layer serves as an insulating layer of said power MOS to prevent said power MOS from discharging.

14. The method according to claim 11, wherein said silicon oxide layer is etched to remove said silicon oxide layer on said sidewalls of said trench and on said silicon nitride layer by using a wet etching process.

* * * * *